(12) United States Patent
Kawaguchi (10) Patent No.: US 7,888,250 B2
(45) Date of Patent: Feb. 15, 2011

(54) METHOD AND APPARATUS FOR ACTIVATING COMPOUND SEMICONDUCTOR

(75) Inventor: Norihito Kawaguchi, Tokyo (JP)

(73) Assignee: IHI Corporation, Tokyo (JP)

( * ) Notice: Subject to any disclaimer, the term of this patent is extended or adjusted under 35 U.S.C. 154(b) by 255 days.

(21) Appl. No.: 12/162,937

(22) PCT Filed: Dec. 18, 2006

(86) PCT No.: PCT/JP2006/325163

§ 371 (c)(1),
(2), (4) Date: Jul. 31, 2008

(87) PCT Pub. No.: WO2007/097103

PCT Pub. Date: Aug. 30, 2007

(65) Prior Publication Data

US 2009/0170296 A1    Jul. 2, 2009

(30) Foreign Application Priority Data

Feb. 23, 2006  (JP) .............................. 2006-046783

(51) Int. Cl.
*H01L 21/425* (2006.01)

(52) U.S. Cl. .................. 438/530; 438/401; 438/487; 438/522; 438/708; 257/12; 257/14; 257/21; 257/64; 257/79; 257/E21.334

(58) Field of Classification Search .................. None
See application file for complete search history.

(56) References Cited

U.S. PATENT DOCUMENTS 6,471,769 B2    10/2002  Hashimoto et al.

(Continued)

FOREIGN PATENT DOCUMENTS

JP          56-131934        10/1981

(Continued)

OTHER PUBLICATIONS

Wataru Utumi, et al., "A new method for congruent melting gallium nitride at a high pressure and growing single crystal", Spring-8 user information, Jan. 2004.

(Continued)

*Primary Examiner*—N Drew Richards
*Assistant Examiner*—Kyoung Lee
(74) *Attorney, Agent, or Firm*—Griffin & Szipl, P.C.

(57) ABSTRACT

A compound semiconductor is placed in a reaction vessel (12) of which the inner gas is subjected to replacement with a low-vapor-pressure gas (2) whose equilibrium vapor pressure at the melting point of the compound semiconductor is 1 atm or lower. The low-vapor-pressure gas is urged to flow along the surface of the compound semiconductor while keeping the internal pressure of the reaction vessel at a value not lower than that equilibrium vapor pressure. The surface of the compound semiconductor is irradiated with a pulsed-laser light (3) whose photon energy is higher than the band gap of the compound semiconductor. Thus, only that part of the compound semiconductor which is located at the pulsed-laser light irradiation position is instantly heated and melted while keeping the atmospheric temperature of the low-vapor-pressure gas at a room temperature or a temperature equal to or lower than the decomposition temperature.

7 Claims, 6 Drawing Sheets

U.S. PATENT DOCUMENTS

2002/0014441 A1* 2/2002 Yoshida et al. ........... 209/127.1

FOREIGN PATENT DOCUMENTS

| JP | 60-027117 | 2/1985 |
| JP | 63-283126 | 11/1988 |
| JP | 09-275081 | 10/1997 |
| JP | 10-284800 | 10/1998 |
| JP | 2000-277448 | 10/2000 |
| JP | 2002-289550 | 10/2002 |
| JP | 2005-183668 | 7/2005 |
| KR | 10-0619655 | 8/2006 |
| KR | 10-0664039 B1 | 12/2006 |

OTHER PUBLICATIONS

Seiji Sarayama, et al., "High-quality crystal growth of gallium nitride by flux method", Ricoh Technical Report No. 30, Dec. 2004.

International Search Report issued in corresponding application No. PCT/JP20061325163, completed Mar. 5, 2007 and mailed Mar. 13, 2007.

Office Action issued in corresponding Korean Application No. 10-2008-7017444, dated Dec. 6, 2010.

* cited by examiner

Temperature and Vapor Pressure of InP

Fig.5

Temperature and Vapor Pressure of GaP

Fig.6

Temperature and Vapor Pressure of GaAs

METHOD AND APPARATUS FOR ACTIVATING COMPOUND SEMICONDUCTOR

This is a National Phase Application in the United States of International Patent Application No. PCT/JP2006/325163 filed Dec. 18, 2006, which claims priority on Japanese Patent Application No. 046783/2006, filed Feb. 23, 2006. The entire disclosures of the above patent applications are hereby incorporated by reference.

TECHNICAL FIELD

The present invention relates to a method and an apparatus for activating a compound semiconductor in which the activity of the compound semiconductor can be improved by melting the compound semiconductor having a high melting point at a normal pressure or a low pressure close to the normal pressure, and slowly and gradually cooling a molten liquid.

BACKGROUND ART

Recently, a semiconductor device using a GaN-based material such as a blue light emitting diode (LED), a white LED, a blue-violet semiconductor laser (LD), or a high frequency device has been attracted.

The GaN-based semiconductor device is realized by heteroepitaxial growth of a GaN-based thin film deposited on a substrate formed of silicon carbide (SiC) or sapphire by an organic metal vapor phase epitaxy (MOVPE) method or a molecular beam epitaxy (MBE) method. In this case, since the thermal expansion coefficients and the lattice constants of the GaN-based thin film and the substrate are significantly different from each other, dislocation (that is, a defect) having high density of $10^9$ cm$^{-2}$ or more occurs in the GaN-based thin film.

Meanwhile, in order to fabricate the white LED, the blue-violet semiconductor laser (LD), and the high frequency device, the development of a high-quality GaN substrate having dislocation density of $10^4$ cm$^{-2}$ or less is required and various technologies have been developed in various research institutions (for example, Non-Patent Documents 1 and 2).

Non-Patent Document 1 is a research report on GaN crystal growth by a molten liquid growth method, in which it was confirmed by experiments that, when GaN is congruently melted without decomposition at a nitrogen pressure of 6 GPa (about 60,000 atm) or more and a high temperature of 2220° C. or above and the molten liquid is cooled, the molten liquid is reversibly returned to a GaN crystal phase.

Non-Patent Document 2 is a research report on GaN crystal growth by a flux method, in which it was confirmed by experiments that high-quality GaN crystal can be grown under growth conditions of a temperature of 800° C. and a nitrogen pressure of 5 MPa (about 50 atm).

A method for activating an impurity ion implanted layer for semiconductor such as SiC or GaN is disclosed in Patent Document 1.

In the "method for activating the impurity ion implanted layer" of Patent Document 1, laser light whose photon energy is equal to or higher than the photon energy (transition energy between band gaps) of a semiconductor material is irradiated to the semiconductor material, to which predetermined impurity elements are doped by ion implantation, in a state in which the semiconductor material is heated.

[Non-Patent Document 1]
Wataru UTUMI, et al., "A new method for congruent melting gallium nitride at a high pressure and growing single crystal", Spring-8 user information, January, 2004

[Non-Patent Document 2]
Shoji SARAYAMA, et al., "High-quality crystal growth of gallium nitride by a flux method", Ricoh Technical Report No. 30, December, 2004

[Patent Document 1]
Japanese Laid-open Patent Application Publication No. 2002-289550, "A method for activating an impurity ion implanted layer"

Since the melting point of GaN is approximately 2220° C. or more and the equilibrium pressure with nitrogen gas at this melting point reaches about 6 GPa (about 60,000 atm) or more, GaN decomposes to Ga metal and nitrogen gas at a high temperature under a low-pressure nitrogen atmosphere and thus single crystal growth means for obtaining single crystal by slowly cooling the molten liquid performed by silicon or the like cannot be applied.

Although the GaN crystal can be grown by the molten liquid growth method of the Non-Patent Document 1, there has been a problem that since the nitrogen pressure of 6 GPa (about 60,000 atm) or more and the high temperature of 2220° C. or more are required, an ultra-high temperature/ultra-high pressure durable apparatus is required.

In the flux method of Non-Patent Document 2, the equilibrium vapor pressure at a temperature of 600 to 800° C. can be reduced to several tens of atm, but a high-pressure device is required.

As in Patent Document 1, even when silicon carbide or gallium nitride is annealed by pulsed-laser light, melting cannot be performed at a vacuum atmosphere or a nitrogen atmosphere. Thus, it is difficult to accomplish high-quality crystal growth.

DISCLOSURE OF THE INVENTION

The present invention is contrived to solve the above-described problems. That is, an object of the present invention is to provide a method and an apparatus for activating a compound semiconductor in which the activity of the compound semiconductor can be improved by melting the compound semiconductor having a high melting point, such as GaN, without decomposition, at a normal pressure or a low pressure close to the normal pressure and by slowly cooling a molten liquid.

According to one aspect of the present invention, there is provided a method for activating a compound semiconductor, which includes the steps of: placing the compound semiconductor in a reaction vessel; replacing atmosphere in the reaction vessel with a low-vapor-pressure gas whose equilibrium vapor pressure at a melting point of the compound semiconductor is one atmospheric pressure or lower; causing the low-vapor-pressure gas to flow along a surface of the compound semiconductor while keeping an internal pressure of the reaction vessel at a value equal to or higher than the equilibrium vapor pressure; and irradiating a pulsed-laser light whose photon energy is higher than a band gap of the compound semiconductor to the surface of the compound semiconductor, thereby permitting only a part of the compound semiconductor located at an irradiation position of the pulsed-laser light to be melted while allowing an atmospheric temperature of the low-vapor-pressure gas to be kept at a room temperature or a temperature not higher than a decomposition temperature.

According to another aspect of the present invention, there is provided an apparatus for activating a compound semiconductor, the apparatus including: a reaction vessel configured to receive therein the compound semiconductor under an airtight state; a gas supplying device configured to supply low-vapor-pressure gas whose equilibrium vapor pressure at a melting point of the compound semiconductor is one atmospheric pressure or lower into the reaction vessel; a gas temperature adjusting device configured to keep an atmospheric temperature of the low-vapor-pressure gas at a room temperature or a temperature equal to or lower than a decomposition temperature; and a pulsed-laser irradiating device configured to irradiate a pulsed-laser light whose photon energy is higher than a band gap of the compound semiconductor to a surface of the compound semiconductor, thereby allowing the inner gas in the reaction vessel to be replaced with the low-vapor-pressure gas, and allowing the low-vapor-pressure gas to flow along the surface of the compound semiconductor while keeping the internal pressure of the reaction vessel at a value equal to higher than the equilibrium vapor pressure, and further allowing the pulsed-laser light to be irradiated onto the surface of the compound semiconductor such that only a part of the compound semiconductor which is located at the irradiation position of the pulsed-laser light is melted.

In a preferred embodiment of the present invention, the compound semiconductor is comprised of gallium nitride, and the low-vapor-pressure gas comprises a gas selected from ammonia gas, hydrazine gas and mixed gas thereof.

Preferably, the pulsed-laser light is homogenized and shaped by a homogenizer to become a shaped line beam.

Further preferably, the pulsed-laser light is irradiated onto the surface of the compound semiconductor while transferring the compound semiconductor along a laser irradiation surface.

Still further preferably, rare earths and transition metal such as erbium (Er), terbium (Tb), europium (Eu) or the like is ion implanted into the compound semiconductor.

Preferably, alkali metal such as sodium, potassium, lithium or the like is ion implanted into the compound semiconductor.

Further preferably, a p-type impurity, an n-type impurity or p-type and n-type impurities is ion implanted into the compound semiconductor.

As described above, since the melting point of GaN is approximately 2220° C. or more and the equilibrium pressure with nitrogen gas at this melting point reaches about 6 GPa (about 60,000 atm) or more, decomposition of GaN to Ga metal and nitrogen gas takes place at a high temperature under a low-pressure nitrogen atmosphere.

In contrast, the equilibrium vapor pressure is low in ammonia and hydrazine and the equilibrium vapor pressure at the melting point of GaN (gallium nitride) is one atmospheric pressure (it will be hereinbelow referred to as 1 atm) or lower.

Accordingly, by using ammonia or hydrazine gas (low-vapor-pressure gas), the equilibrium vapor pressure at the melting point of the gallium nitride may be 1 atm or lower. However, since ammonia or hydrazine begins to be decomposed to nitrogen and hydrogen at the atmosphere temperature of 300° C. or more, the low-vapor-pressure gas is decomposed when the compound semiconductor is heated to 300° C. or more by a heat-treating device.

Accordingly, in the present invention, only the compound semiconductor at the irradiation position of the pulsed-laser light is instantly heated and melted while keeping the atmospheric temperature of the low-vapor-pressure gas at a room temperature or a temperature not higher than a decomposition temperature, so that the compound semiconductor is melted without decomposition thereof while suppressing the decomposition of the low-vapor-pressure gas.

Accordingly, the following effects can be obtained by the method and the apparatus according to the present invention.

(1) Since the pulsed-laser light whose photon energy is higher than the band gap of the compound semiconductor is irradiated, the compound semiconductor can be heated to the melting point of several tens of nanoseconds.

(2) By using the atmosphere gas (low-vapor-pressure gas) whose the equilibrium vapor pressure at the melting point is 1 atm or lower, it is possible to configure an apparatus having a transferring system.

(3) Since the decomposition of the atmospheric gas can be suppressed by instantly melting the compound semiconductor by the pulsed-laser light, a variation in the equilibrium vapor pressure is always reluctant to occur.

(4) Since the pulsed-laser light is shaped to a line beam due to homogenization by an optical system (a homogenizer) and the substrate is allowed to be transferred, it is possible to perform a process of activating the wafer of a large-sized substrate.

BEST MODE FOR CARRYING OUT THE INVENTION

Hereinafter, exemplary embodiments of the present invention will be described in detail with reference to the accompanying drawings. The common portions of the drawings are denoted by the same reference numerals and the duplicated description will be omitted.

Figure 1:
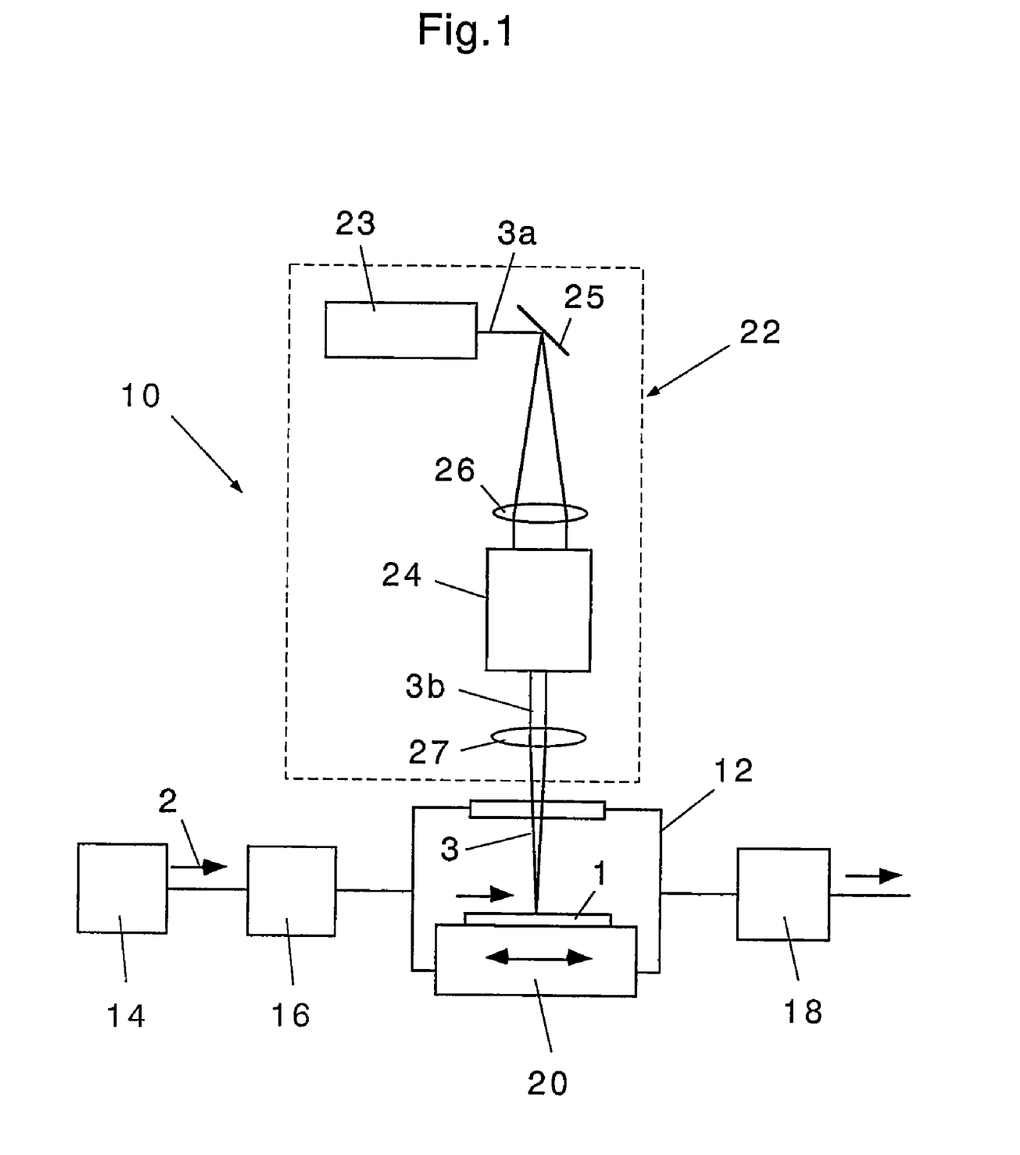
FIG. 1 is a schematic block diagram illustrating the configuration of an activating apparatus according to the present invention.

FIG. 1 is a schematic block diagram illustrating the configuration of an activating apparatus according to the present invention.

As shown in this drawing, the activating apparatus 10 according to the present invention includes a reaction vessel 12, a gas supplying device 14, a gas temperature adjusting device 16, a gas discharging device 18, a substrate movement device 20 and a pulsed-laser light irradiating device 22.

The reaction vessel 12 is a closed vessel in which a substrate 1 having compound semiconductor on the surface thereof is placed under an airtight state. In the present invention, the compound semiconductor is, for example, gallium nitride (GaN). However, the present invention is not limited thereto. The compound semiconductor may be nitride-based semiconductor, InP, GaP or GaAs.

The gas supplying device 14 includes a gas supplying source for supplying low-vapor-pressure gas 2 at a predetermined pressure, a pressure adjuster for adjusting the lowvapor-pressure gas 2 supplied from the gas supplying source to a pressure equal to or higher than an equilibrium vapor pressure at the melting point of the compound semiconductor, and a flow rate adjuster for supplying the low-vapor-pressure gas 2 at a predetermined flow rate, and supplies the low-vapor-pressure gas 2 into the reaction vessel 12 at the pressure equal to or higher than the equilibrium vapor pressure.

In the present invention, the "low-vapor-pressure gas" indicates a gas whose equilibrium vapor pressure at the melting point of the compound semiconductor is 1 atm or lower. For example, if the compound semiconductor is gallium nitride (GaN), the low-vapor-pressure gas 2 is ammonia gas, hydrazine or mixed gas thereof.

If the compound semiconductor is the nitride-based semiconductor, InP, GaP or GaAs, the low-vapor-pressure gas whose equilibrium vapor pressure at the melting point of the compound semiconductor is 1 atm or lower is selected. The low-vapor-pressure gas suitable for InP, GaP or GaAs is, for example, $PH_3$ or $AsH_3$.

The gas temperature adjusting device 16 includes a heater provided at the downstream side of the gas supplying device 14 and a temperature controller for controlling a gas temperature of the heater, and keeps the temperature of the atmosphere of the low-vapor-pressure gas 2 supplied to the reaction vessel 12 at a room temperature or a temperature not higher than a decomposition temperature.

The gas discharging device 18 includes a discharge pump for discharging the gas in the reaction vessel 12 and a pressure adjuster for constantly keeping the pressure of the gas in the reaction vessel 12, and discharges the internal gas while constantly keeping the pressure of the gas in the reaction vessel 12. The gas discharging device 18 has a vacuum pump for depressurizing the inside of the reaction vessel 12 to vacuum such that the inner gas in the reaction vessel 12 can be completely replaced with the low-vapor-pressure gas 2.

The substrate movement device 20 includes a substrate base which can be reciprocally moved and on which the substrate 1 is mounted and a driving device which is for reciprocally moving the substrate base, and moves the substrate 1 along the surface thereof. The substrate movement device 20 includes a preheater for preheating the substrate 1 such that the substrate 1 is heated to the temperature equal to or lower than the decomposition temperature of the compound semiconductor and is kept heated.

The pulsed-laser light irradiating device 22 includes a laser oscillator 23, a pulsed-laser light shaping optical system 24, a reflection mirror 25, a condenser lens 26, and a condensing lens 27, and condenses and irradiates light onto the surface of the compound semiconductor.

The laser oscillator 23 oscillates a pulsed-laser light 3a. The pulsed-laser light 3a irradiated by the laser oscillator 23 is a pulsed-laser light whose band gap is higher than that of the compound semiconductor. The wavelength of the pulsed-laser light 3a can be selected from an ultraviolet light to a visible light according to the band gap of the compound semiconductor.

If the compound semiconductor is GaN, InP, GaP or GaAs, for example, excimer laser light, YAG laser light, or the like may be used as the pulsed-laser light whose band gap is higher than that of the compound semiconductor.

The pulsed-laser light shaping optical system 24 shapes the pulsed-laser light 3a irradiated by the laser oscillator 23 to a uniform line beam 3b in a long-axis direction (for example, a direction orthogonal to the drawing).

The pulsed-laser light shaping optical system 24 includes, for example, an orthogonal cylindrical array which is located orthogonally to the pulsed-laser light 3a so as to divide the pulsed-laser light in a line shape, a condensing lens for condensing the pulsed-laser light divided in the line shape to a focus surface, and a first cylindrical lens for shaping the condensed pulsed-laser light to a line beam.

The orthogonal cylindrical array may be a pair of cylindrical arrays which are orthogonal to each other. Alternatively, a well-known homogenizer may be used.

A reference numeral 25 is a reflection mirror. The pulsed-laser light 3a is reflected downward by the mirror 25 and is irradiated to the upper surface of the substrate 1 via a transparent window provided in the reaction vessel 12.

Owing to the above-described configuration, the low-vapor-pressure gas 2 whose the equilibrium vapor pressure at the melting point of the compound semiconductor is 1 atm or lower can be supplied into the reaction vessel 12, in a state where the substrate 1 is kept at a temperature (for example, about 500° C. or less), in which the compound semiconductor is not decomposed, by the preheater of the substrate movement device 20 in the reaction vessel 12, while keeping the temperature of the atmosphere at the room temperature or the temperature equal to or lower than the decomposition temperature by the gas temperature adjusting device 16.

The pulsed-laser light 3a is shaped in the line beam 3b in which the long-axis direction is homogenized by the pulsed-laser light irradiating device 22 such that the light is uniformly irradiated onto the surface of the substrate.

Using the above-described activating apparatus 10, in an activating method according to the present invention, (Step 1) the substrate 1 having the compound semiconductor on the surface thereof is placed in the reaction vessel 12, (Step 2) the inner gas in the reaction vessel 12 is replaced with a low-vapor-pressure gas 2 whose equilibrium vapor pressure at the melting point of the compound semiconductor is 1 atm or lower, (Step 3) the low-vapor-pressure gas 2 is urged to flow along the surface of the compound semiconductor while keeping the internal pressure of the reaction vessel 12 at a value not lower than that equilibrium vapor pressure, and (Step 4) the surface of the compound semiconductor is irradiated with a pulsed-laser light 3 whose photon energy is higher than the band gap of the compound semiconductor.

The compound semiconductor is preferably gallium nitride (GaN), but the present invention is not limited thereto. The compound semiconductor may be nitride-based semiconductor, InP, GaP, or GaAs.

If the compound semiconductor is gallium nitride (GaN), the low-vapor-pressure gas is preferably ammonia gas, hydrazine, or mixed gas thereof.

If the compound semiconductor is the nitride-based semiconductor, InP, GaP, or GaAs, the low-vapor-pressure gas whose equilibrium vapor pressure at the melting point of the compound semiconductor is 1 atm or lower is selected.

Rare earths and transition metal such as erbium (Er), terbium (Tb), europium (Eu), or the like, alkali metal such as sodium, potassium, lithium or the like or a p-type impurity, an n-type impurity, or p-type and n-type impurities is preferably ion implanted into the compound semiconductor.

By the activating method according to the present invention, only the part of the compound semiconductor which is located at the irradiation position of the pulsed-laser light 3 is instantly heated and melted while keeping the temperature of the atmosphere of the low-vapor-pressure gas 2 at the room temperature or the temperature not higher than the decomposition temperature.

Figure 2:
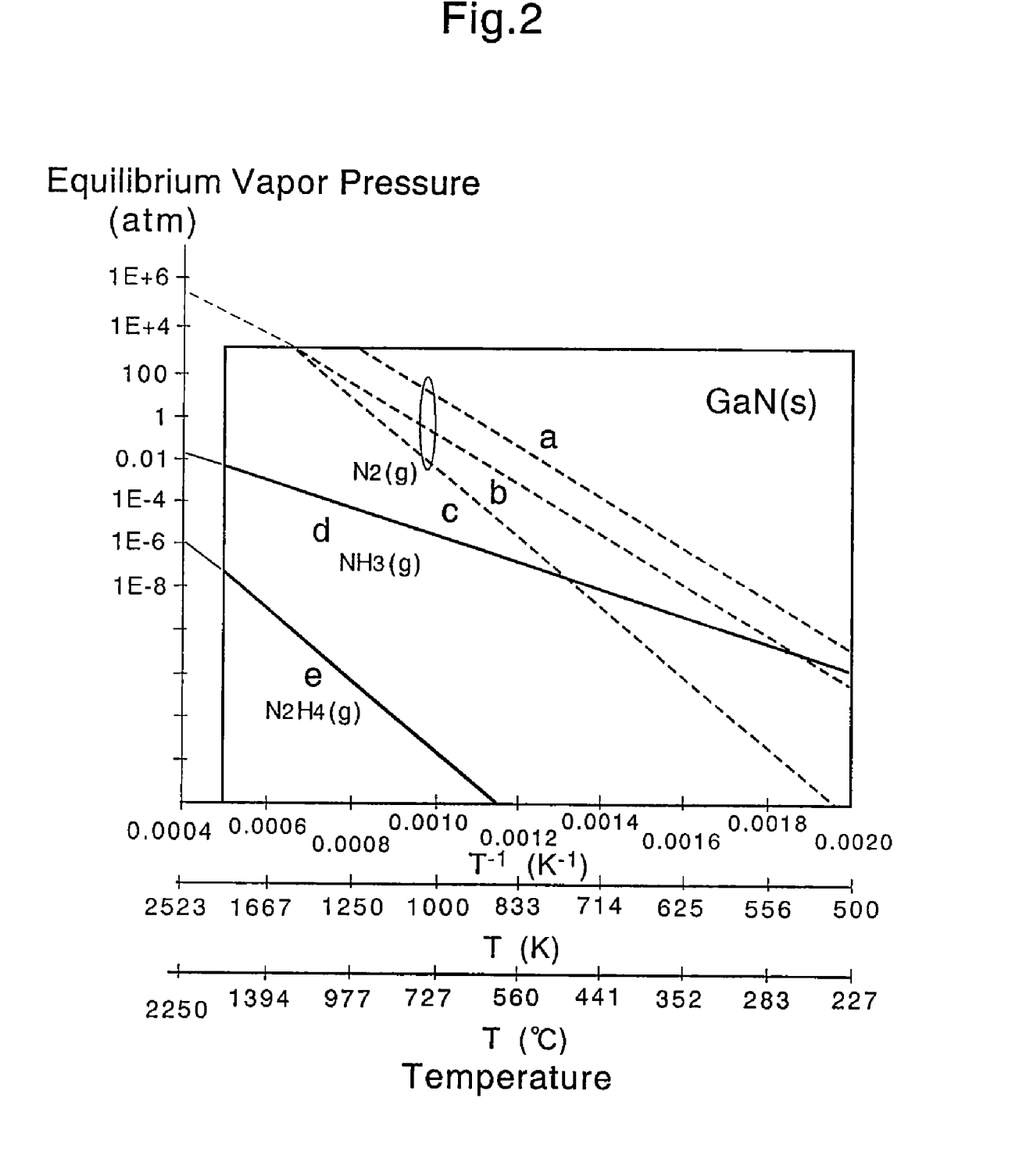
FIG. 2 is a diagrammatic view illustrating a relationship between a temperature and an equilibrium vapor pressure in several gases of gallium nitride (GaN)

FIG. 2 is a diagram showing a relationship between the temperature (horizontal axis) and the equilibrium vapor pressure (vertical axis) in the several gases of gallium nitride (GaN). As shown in this drawing, in the nitrogen atmosphere (a, b and c of the drawing), the equilibrium vapor pressure becomes 1 atm at about 1200° C. and becomes several tens of thousands of atm at the melting point of about 2500° C. In addition, a, b, and c of the drawing is based on other research report in the nitrogen atmosphere.

Meanwhile, in ammonia d and hydrazine e, the equilibrium vapor pressure is low (about $10^{-2}$ atm at 1200° C.) and the equilibrium vapor pressure at the melting point is 1 atm or lower.

Accordingly, it can be seen from this drawing that the equilibrium vapor pressure at the melting point of gallium nitride becomes 1 atm or less by using ammonia or hydrazine as the low-vapor-pressure gas.

However, since decompression to nitrogen and hydrogen is started at an atmosphere temperature not lower than 300° C. in ammonia or hydrazine, the low-vapor-pressure gas is decompressed at the time of heating of the heating device.

Accordingly, in the present invention, by irradiating the pulsed-laser light 3 whose photon energy is higher than the band gap of the compound semiconductor, only the semiconductor is instantly heated from the room temperature to the melting point while keeping the temperature of the atmosphere of the low-vapor-pressure gas 2 at the room temperature or the temperature not higher than the decomposition temperature. Accordingly, the semiconductor can be melted without decompressing the low-vapor-pressure gas 2 such as ammonia and the activity of the compound semiconductor can be improved by slowly and gradually cooling the molten liquid.

Figure 3:
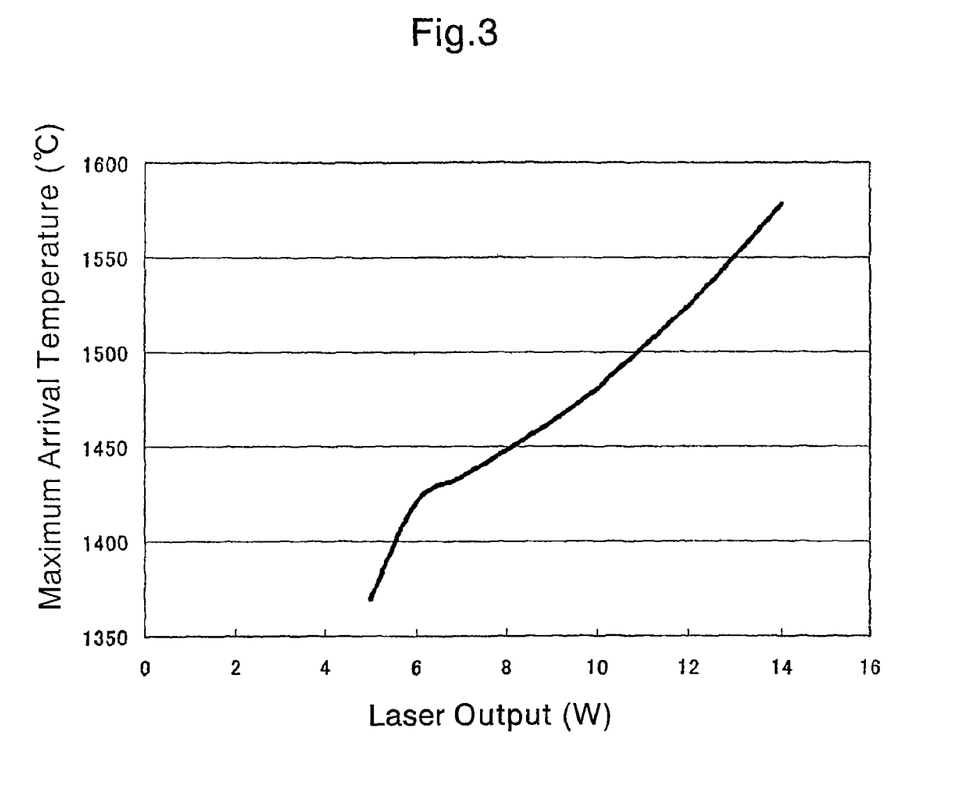
FIG. 3 is a diagrammatic view illustrating a relationship between a laser output and a maximum arrival temperature of the surface of a thin film in a case where a substrate is formed of silicon.

FIG. 3 is a diagram showing a relationship between a laser output (horizontal axis) and a maximum arrival temperature (vertical axis) when the substrate is formed of silicon, which is obtained by heat analysis. As a result, in the laser output (10 W or more) in which the Raman half bandwidth of the thin film is 4.16 $cm^{-1}$, it is judged that silicon is melted and recrystallized by the laser at the melting point (about 1414° C.) of silicon or more. From this experimental result, it is confirmed that a heating process is performed to a temperature exceeding the melting point of the semiconductor wafer using the pulsed-laser light and the semiconductor thin film is crystallized such that the semiconductor wafer is melted and recrystallized so as to improve crystal quality. In the present invention, this means is applied to compound semiconductor other than silicon.

Figure 4:
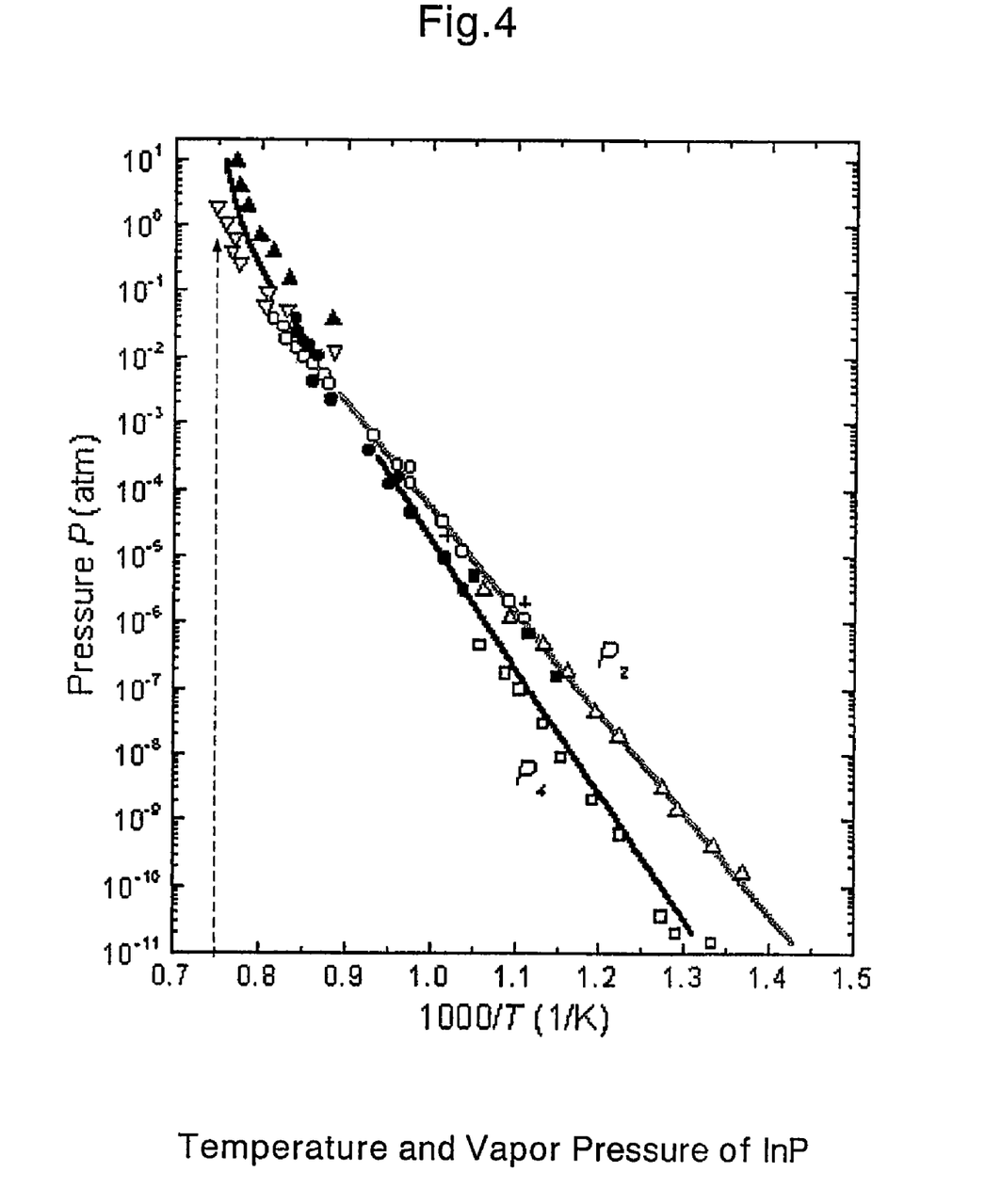
FIG. 4 is a diagrammatic view illustrating a relationship between the temperature and the vapor pressure of InP.

FIG. 4 is a diagram showing a relationship between the temperature and the vapor pressure of InP. In this drawing, a horizontal axis is 1000/T (T is a temperature K), a vertical axis is the vapor pressure (atm), and two curves in the drawing represent the relationship in the different molecular structures.

The melting point of InP is 1333 K and corresponds to 0.75 in the horizontal axis of this drawing, and the vapor pressure thereof is generally 2 to 10 atm.

Even in such a case, in the present invention, since the low-vapor-pressure gas whose the equilibrium vapor pressure at the melting point of the compound semiconductor is 1 atm or lower is selected, only the part of the compound semiconductor which is located at the pulsed-laser light irradiation position is instantly heated and melted while keeping the temperature of the low-vapor-pressure gas atmosphere at the room temperature or a temperature equal to or lower than the decomposition temperature and the molten liquid is slowly cooled, such that the activity of the compound semiconductor can be improved.

Figure 5:
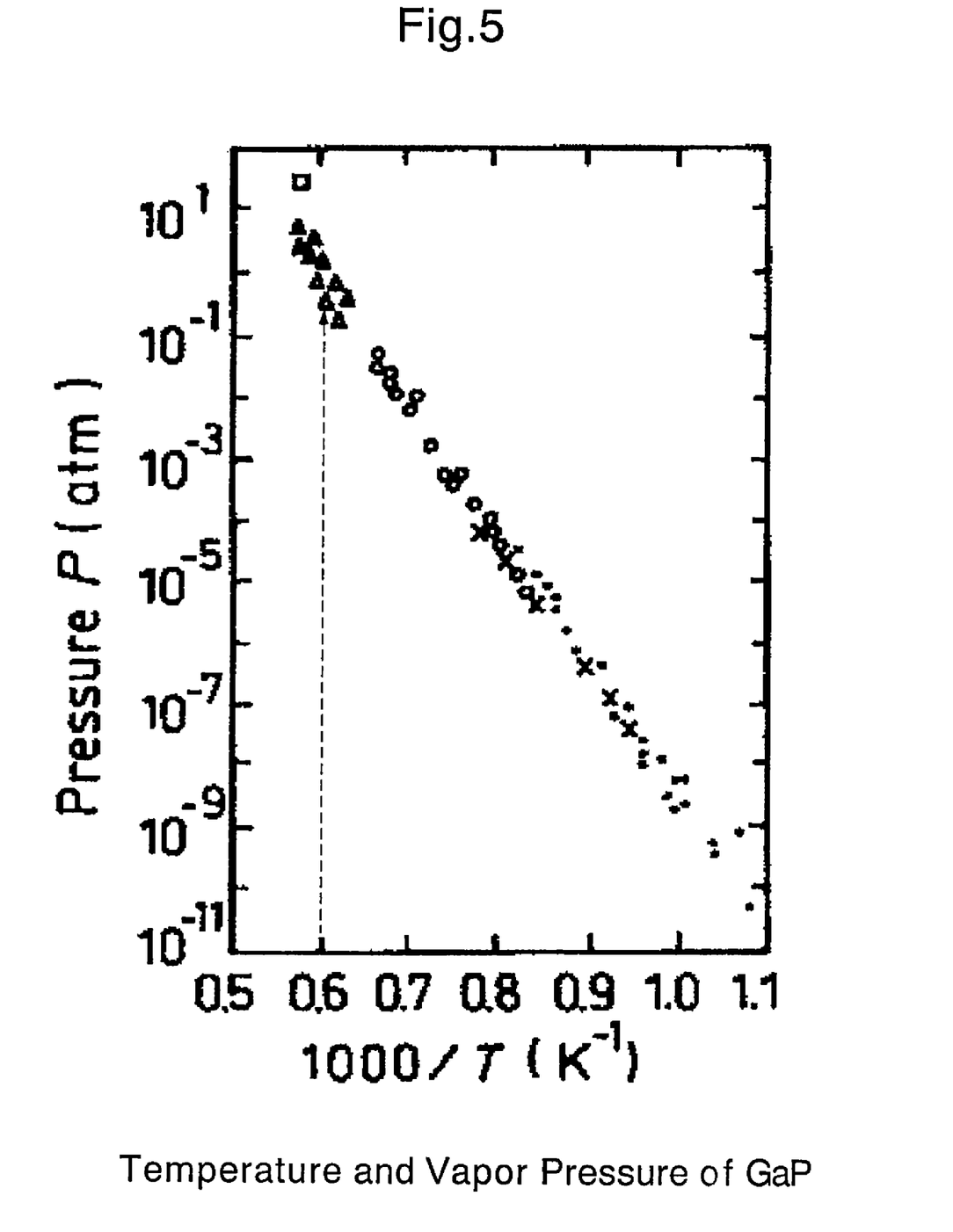
FIG. 5 is a diagrammatic view illustrating a relationship between the temperature and the vapor pressure of GaP.
Figure 6:
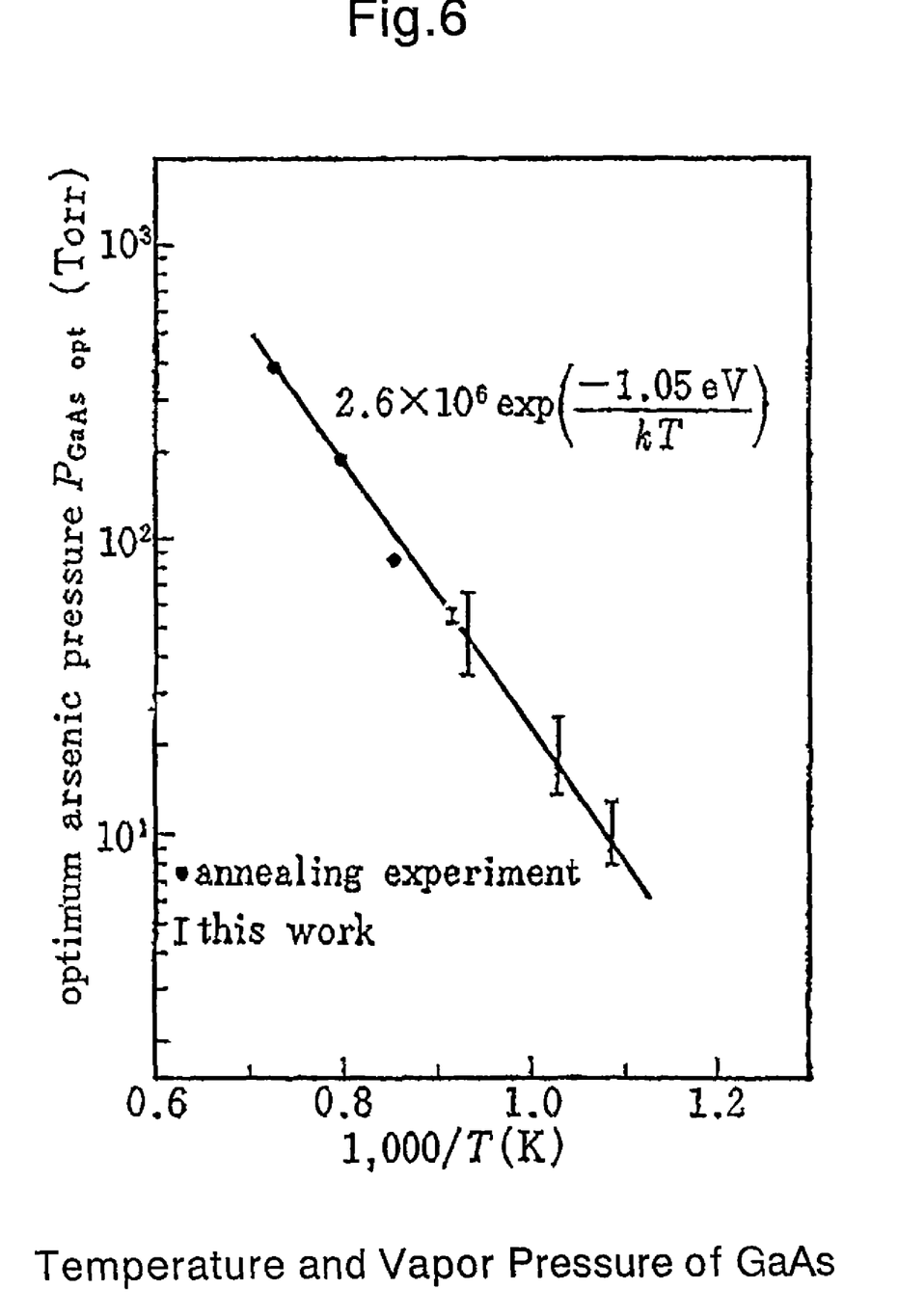
FIG. 6 is a diagrammatic view illustrating a relationship between the temperature and the vapor pressure of GaAs.

FIG. 5 is a diagram showing a relationship between the temperature and the vapor pressure of GaP, and FIG. 6 is a diagram showing a relationship between the temperature and the vapor pressure of GaAs.

The melting point of GaP is 1457° C. and corresponds to 0.6 in the abscissa of FIG. 5, and the vapor pressure thereof is generally approximately 10 atm. The melting point of GaAs is 1240° C. and corresponds to 0.6 in the abscissa of FIG. 6, and the vapor pressure thereof is generally about 1.05 atm (800 torr).

Even in these compound semiconductors, when the low-vapor-pressure gas (for example, $PH_3$) whose the equilibrium vapor pressure at the melting point of the compound semiconductor is 1 atm or lower is selected, by the present invention, only the part of the compound semiconductor which is located at the pulsed-laser light irradiation position is instantly heated and melted while keeping the temperature of atmosphere of the low-vapor-pressure gas 2 at the room temperature or the temperature equal to or lower than the decomposition temperature and the molten liquid is slowly and gradually cooled, such that the activity of the compound semiconductor can be improved.

In the (Step 4), it is preferable that the pulsed-laser light 3 is directly irradiated to the compound semiconductor on the surface of the substrate 1. If the substrate is transparent, the pulsed-laser light may be irradiated from the side of the transparent substrate.

Here, by directly irradiating the pulsed-laser light 3 to the compound semiconductor on the substrate 1, only the compound semiconductor can be locally heated and the irradiation time of the pulsed-laser light 3 until only the compound semiconductor is heated and melted can be extremely shortened.

As described above, in the present invention, the pulsed-laser light 3 whose band gap in which the equilibrium vapor pressure at the melting point significantly exceeding 1 atm is higher than that of the compound semiconductor is irradiated and, in the low-vapor-pressure gas 2 in which the equilibrium vapor pressure at the melting point is lower than 1 atm and at the room temperature or a temperature not higher than a temperature in which the decompression of the low-vapor pressure gas is started, the compound semiconductor can be melted without decompression and thus re-growth and activation can be realized.

The present invention is not limited to the above-described embodiment and may be variously modified without departing from the scope of the present invention.

The invention claimed is:

1. A method for activating a compound semiconductor, comprising the steps of:
    placing the compound semiconductor in a reaction vessel;
    replacing an inner gas in the reaction vessel with a low-vapor-pressure gas whose equilibrium vapor pressure at a melting point of the compound semiconductor is one atmospheric pressure or lower;
    causing low-vapor-pressure gas to flow along a surface of the compound semiconductor while keeping an internal pressure of the reaction vessel at a value equal to or higher than the equilibrium vapor pressure; and
    irradiating a pulsed-laser light whose photon energy is higher than a band gap of the compound semiconductor to the surface of the compound semiconductor,
    thereby permitting only a part of the compound semiconductor located at an irradiation position of the pulsed-laser light to be melted while allowing an atmospheric temperature of the low-vapor-pressure gas to be kept at a room temperature or a temperature not higher than a decomposition temperature.

2. The method according to claim 1, wherein:

the compound semiconductor comprises gallium nitride, and the low-vapor-pressure gas comprises a gas selected from ammonia gas, hydrazine gas, and mixed gas thereof.

3. The method according to claim 1, wherein the pulsed-laser light is homogenized and shaped by a homogenizer to become a shaped line beam.

4. The method according to claim 1, wherein the pulsed-laser light is irradiated onto the surface of the compound semiconductor while transferring the compound semiconductor along a laser irradiation surface.

5. The method according to claim 1, wherein rare earths and transition metal such as erbium (Er), terbium (Tb), or europium (Eu) is ion implanted into the compound semiconductor.

6. The method according to claim 1, wherein alkali metal such as sodium, potassium, or lithium is ion implanted into the compound semiconductor.

7. The method according to claim 1, wherein a p-type impurity, an n-type impurity, or p-type and n-type impurities is ion implanted into the compound semiconductor.

* * * * *